US006876183B2

(12) United States Patent
Cannon (10) Patent No.: US 6,876,183 B2
(45) Date of Patent: Apr. 5, 2005

(54) SYSTEMS AND METHODS FOR MAKING A HIGH-BANDWIDTH COAXIAL CABLE CONNECTION

(75) Inventor: James E. Cannon, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 71 days.

(21) Appl. No.: 10/395,989

(22) Filed: Mar. 24, 2003

(65) Prior Publication Data

US 2004/0189276 A1 Sep. 30, 2004

(51) Int. Cl.[7] .......................... G01R 31/02; H01R 9/05
(52) U.S. Cl. ..................................... 324/72.5; 439/578
(58) Field of Search ............................. 324/437, 446, 324/449, 754, 755, 757, 758, 715, 724, 690, 696, 72, 72.5, 538; 439/63, 429, 551, 578, 579, 584, 675, 482, 322

(56) References Cited

U.S. PATENT DOCUMENTS

| 3,676,744 | A | * | 7/1972 | Pennypacker | 333/125 |
|---|---|---|---|---|---|
| 5,145,382 | A | * | 9/1992 | Dickirson | 439/63 |
| 5,274,336 | A | * | 12/1993 | Crook et al. | 324/690 |
| 5,926,076 | A | * | 7/1999 | Johnson et al. | 333/109 |
| 5,936,421 | A | * | 8/1999 | Stowers et al. | 324/761 |
| 6,053,755 | A | * | 4/2000 | Oldfield | 439/289 |
| 6,124,723 | A | * | 9/2000 | Costello | 324/762 |
| 6,210,222 | B1 | * | 4/2001 | Langham et al. | 439/583 |
| 6,252,391 | B1 | * | 6/2001 | McAllister et al. | 324/149 |
| 6,530,808 | B1 | * | 3/2003 | Hosler et al. | 439/585 |
| 6,552,523 | B2 | * | 4/2003 | Huard | 324/72.5 |
| 6,683,773 | B2 | * | 1/2004 | Montena | 361/119 |
| 2003/0027453 | A1 | * | 2/2003 | Yeh | 439/578 |
| 2003/0222665 | A1 | * | 12/2003 | Dascher | 324/715 |
| 2004/0085057 | A1 | * | 5/2004 | McTigue | 324/72.5 |

\* cited by examiner

Primary Examiner—N. Le
Assistant Examiner—Hoai-An D. Nguyen (57) ABSTRACT

Electronic probes are provided. One such electronic probe includes: a housing configured to house electronic components; a coaxial cable connector configured to rotationally engage the housing, the coaxial cable connector having at least one inner surface that faces at least a portion of a first hole that extends through the coaxial cable connector, and having at least one outer surface; a coaxial cable having an inner conductor and an outer conductor, the outer conductor being attached to the at least one inner surface of the coaxial cable connector, and the inner conductor extending through the first hole in the coaxial cable connector. Methods and other systems are disclosed.

40 Claims, 6 Drawing Sheets

FIG. 6

SYSTEMS AND METHODS FOR MAKING A HIGH-BANDWIDTH COAXIAL CABLE CONNECTION

BACKGROUND

Many electronic probes (e.g., voltage or current probes) include a thin coaxial cable for carrying a signal to a measuring instrument. The thin coaxial cable is typically connected to an amplifier unit at one end, and to an interface (also known as a pod) for connecting to a measuring instrument. The thin coaxial cable is flexible and allows an electronic probe to be manipulated while maintaining a connection to a device being tested. One problem with using a thin coaxial cable is that it can be easily damaged. For example, external forces on the cable may cause its outer conductor to be dented. Such damage to the cable results in a high level of signal reflections, and thus limits the bandwidth capability of an electronic probe in which the cable is used.

One prior method of connecting a coaxial cable to an amplifier unit includes machining a cylindrical boss onto the amplifier unit. The coaxial cable is then cut to a precise length, and its coaxial braid is cut and spread over the cylindrical boss. A crimp sleeve is then slid over the coaxial braid, and a crimp die is used to crimp the cable in position.

Disadvantages of this prior method include: a weak physical connection between the coaxial cable and the amplifier unit, unacceptably high reflection losses at frequencies over 4 gigahertz (GHz), unacceptable deviations in inter-cable impedance from 50 ohms, difficulty in creating the connection, high variations in the quality of the connection, difficulty in disconnecting the cable when an electronic probe fails a quality test, and likely damage to the cable when disconnecting it from the amplifier unit. Based on the foregoing, it should be understood that there is a need for systems and methods that address these and/or other perceived shortcomings of the prior art.

SUMMARY

An embodiment of an electronic probe includes: a housing configured to house electronic components; a coaxial cable connector configured to rotationally engage the housing, the coaxial cable connector having at least one inner surface that faces at least a portion of a first hole that extends through the coaxial cable connector, and having at least one outer surface; a coaxial cable having an inner conductor and an outer conductor, the outer conductor being attached to the at least one inner surface of the coaxial cable connector, and the inner conductor extending through the first hole in the coaxial cable connector.

An embodiment of a method for manufacturing an electronic probe includes: attaching a coaxial cable having an inner conductor and an outer conductor to a connector that has at least one inner surface that faces at least a portion of a first hole that extends through the coaxial cable connector, and that has at least one outer surface, wherein the outer conductor is attached to the at least one inner surface of the coaxial cable connector, and the inner conductor extends through the first hole in the coaxial cable connector; and rotating the coaxial cable connector in order to attach the coaxial cable connector to a housing that houses electronic components.

Other systems, methods, features and/or advantages will be or may become apparent to one with skill in the art upon examination of the following figures and detailed description. It is intended that all such additional systems, methods, features, and/or advantages be included within this description and be protected by the accompanying claims.

BRIEF DESCRIPTION OF THE DRAWINGS

In the drawings, like reference numerals designate corresponding parts throughout the several views. The components in the drawings are not necessarily drawn to scale

DETAILED DESCRIPTION

According to one embodiment, a coaxial cable is attached to a coaxial cable connector such that an outer conductor of the coaxial cable maintains a constant inner diameter and remains coaxial with an inner conductor, without experiencing any distortions or discontinuities. This embodiment substantially reduces signal reflection at the region of contact between the outer conductor and the coaxial cable connector, and allows the coaxial cable to support applications involving frequencies over 20 GHz. Furthermore, the coaxial cable may be easily connected to and disconnected from another electronic probe component (e.g., an amplifier unit) without being damaged.

Figure 1:
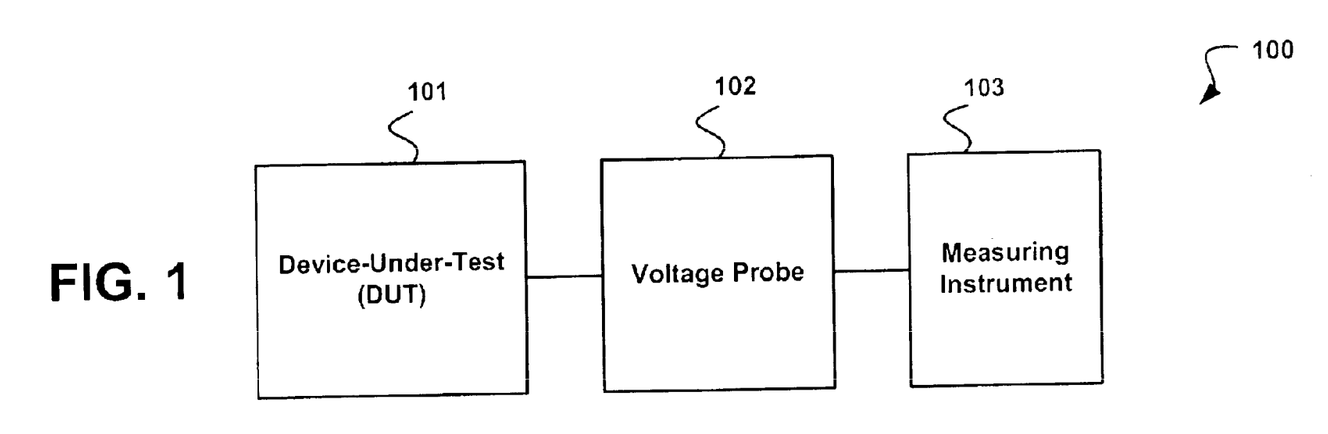
FIG. 1 is a block diagram depicting an embodiment of a measurement system.

FIG. 1 is a block diagram depicting an embodiment of a measurement system 100. The measurement system 100 includes an electronic probe 102 that is coupled to a measuring instrument 103 and to a device-under-test 101. The device-under-test 101 may be, for example, an electronic device or circuit that is to be tested. The probe 102 is configured to provide the measuring instrument 103 with a probe signal that is responsive to one or more test signals received by the probe 102 from a device-under-test 101. The probe 102 may be, for example, a voltage probe or a current probe. The measuring instrument 103 is configured to measure one or more characteristics of the probe signal received from the probe 102. The measuring instrument 103 may be, for example, an oscilloscope, a spectrum analyzer, a logic analyzer, a vector analyzer, a network analyzer, or a time interval analyzer.

Figure 2:
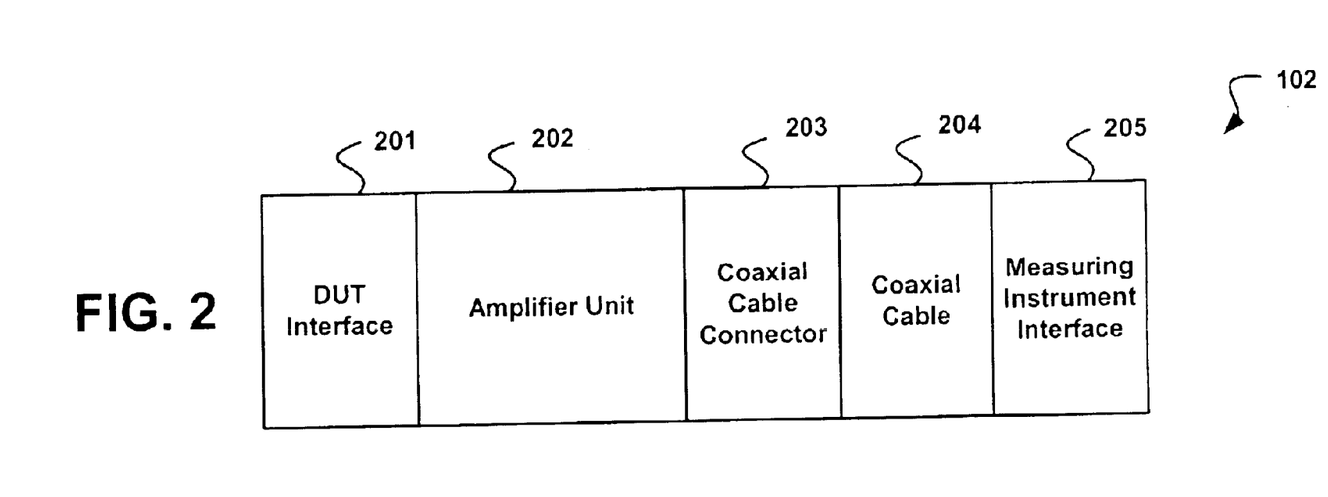
FIG. 2 is a block diagram depicting an embodiment of selected components of an electronic probe.

FIG. 2 is a block diagram depicting an embodiment of selected components of a probe 102. The probe 102 includes a device-under-test (DUT) interface 201, an amplifier unit 202, a coaxial cable connector 203, a coaxial cable 204, and a measuring instrument interface 205. The DUT interface 201 may include, for example, one or more wires, pins, or other conducting means that is/are configured to contact one or more respective probing points in a device-under-test 101. The amplifier unit 202 is connected to the coaxial cable 204 via the coaxial cable connector 203. The amplifier unit 202 houses electronic components that are configured to detect and/or amplify one or more test signals received via the DUT interface 201. In an alternative embodiment, electronic components for detecting and/or amplifying a test signal may be housed in a plurality of respective units.

The coaxial cable 204 is preferably connected to the coaxial cable connector 203 by soldering a coaxial braid of the coaxial cable 204 to the coaxial cable connector 203. The coaxial cable connector 203 is configured to rotationally engage the amplifier unit 202. For example, a threaded portion of the coaxial cable connector 203 may be configured to engage a groove that is located in a cylindrical surface of the amplifier unit 202. The coaxial cable 204 conducts a signal from the amplifier unit 202 to the measuring instrument 103 via the measuring instrument interface 205 (also known as a pod). The measuring instrument interface 205 is attached to the coaxial cable 204 and is configured to be connected to the measuring instrument 103.

Figure 3A:
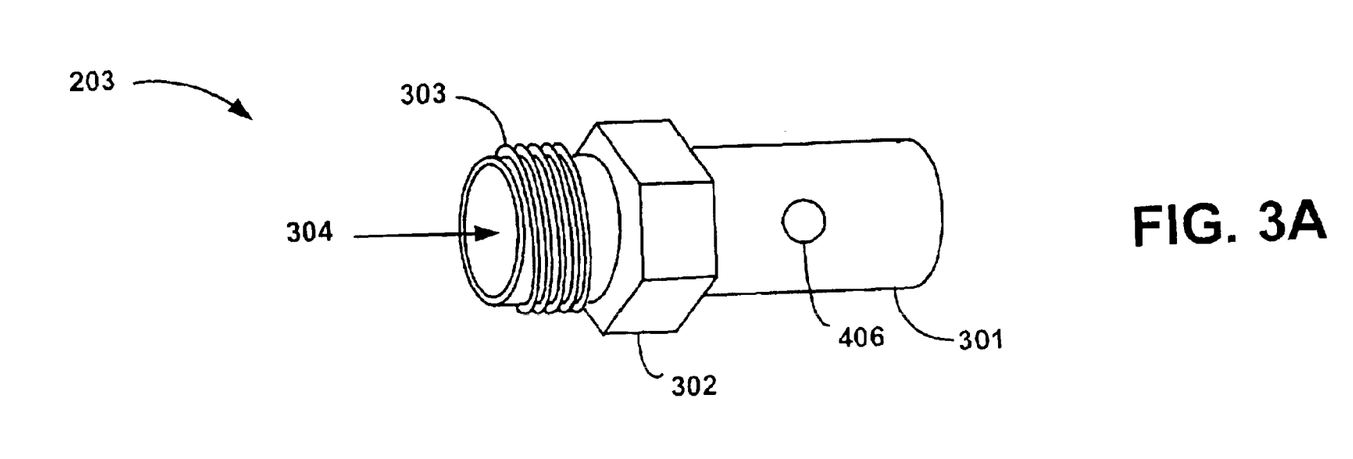
FIGS. 3A and 3B are schematic diagrams depicting an embodiment of a coaxial cable connector.
Figure 3B:
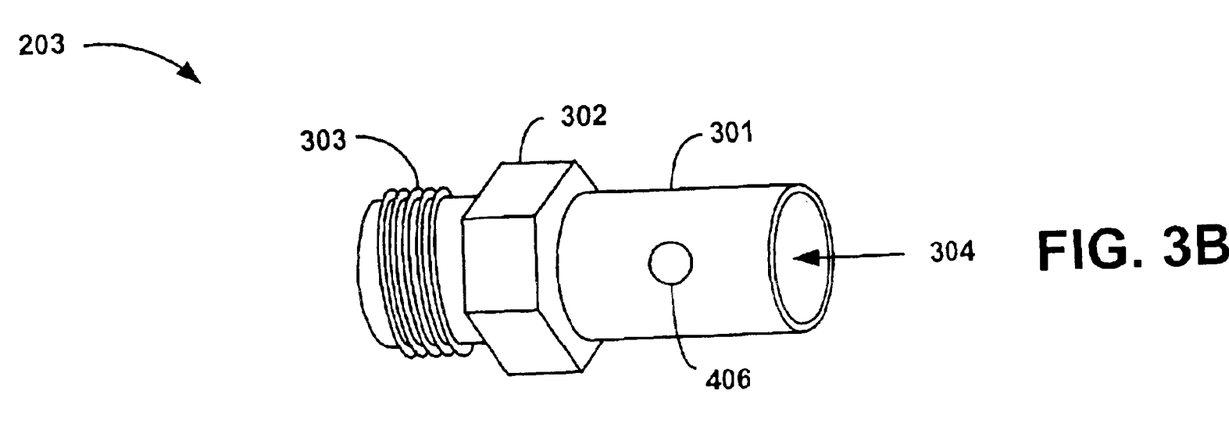

FIGS. 3A and 3B are schematic diagrams depicting an embodiment of a connector 203. The coaxial cable connector 203 includes a cable interface 301, a rotation tool interface 302 and a threaded portion 303. The cable interface 301 is preferably cylindrically shaped and is configured to be attached to the coaxial cable 204 (FIG. 2). For example, a coaxial braid within the coaxial cable 204 may be soldered to an interior surface of the cable interface 301, as will be discussed in more detail below. The cable interface 301 may include a hole 406 for receiving solder material during the soldering process. The rotation tool interface 302 is configured to engage a rotation tool (e.g., a wrench) for rotating the coaxial cable connector 203. The threaded portion 303 is configured to engage a groove that is located in a cylindrical surface of the amplifier unit 202. A hole 304, which is configured to receive a portion of the coaxial cable 204, runs through the cable interface 301, the rotation tool interface 302, and the threaded portion 303.

Figure 4A:
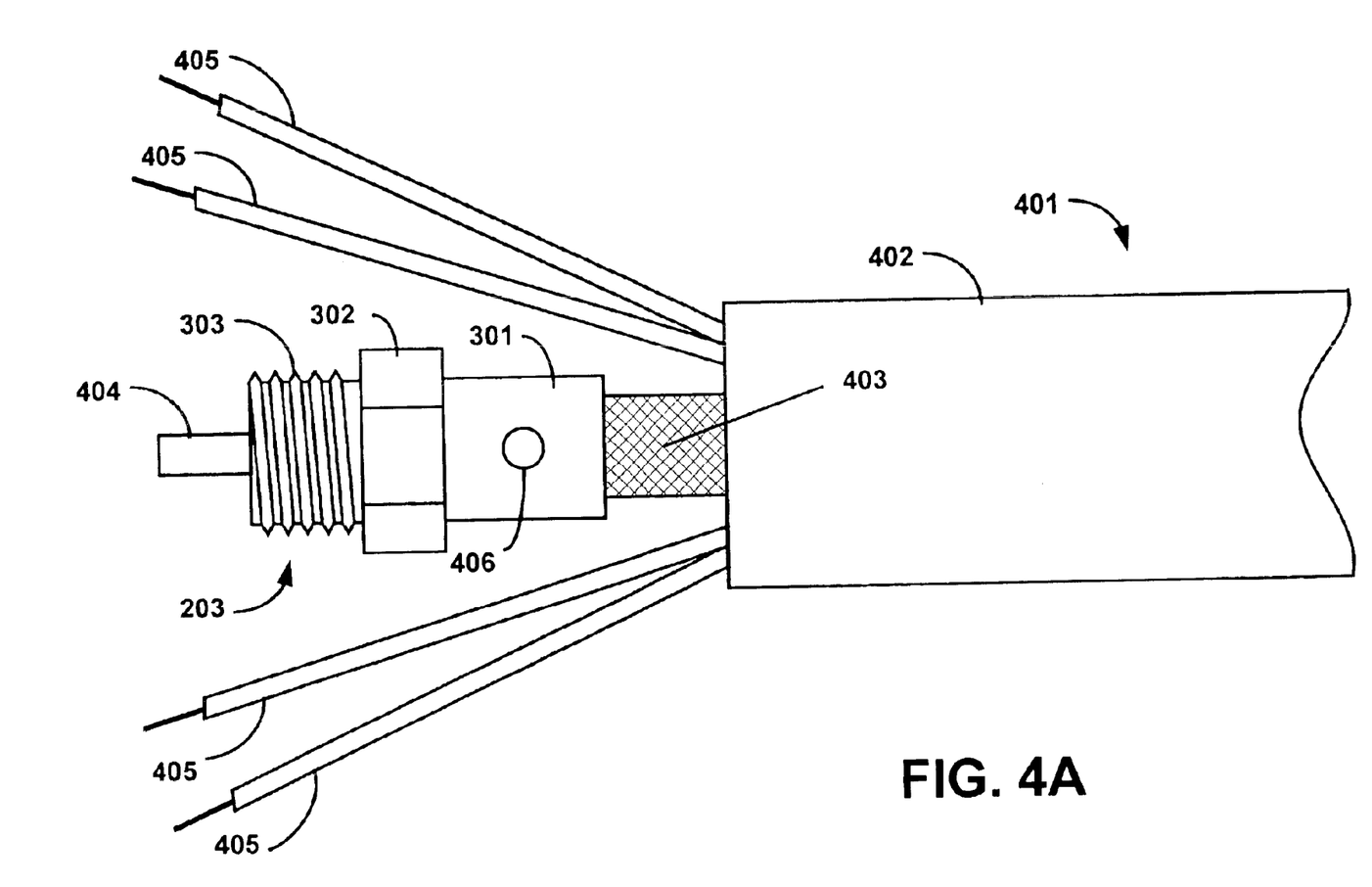
FIG. 4A is a schematic diagram showing an embodiment of a coaxial cable connector that is connected to a cable assembly.

FIG. 4A is a schematic diagram showing an embodiment of a connector 203 that is connected to a cable assembly 401. The cable assembly 401 includes an outer jacket 402, an outer conductor 403 (e.g., a coaxial braid), an inner conductor 404, and wires 405, among other components (not shown). The outer conductor 403 and the inner conductor 404 are part of a coaxial cable that extends through the cable assembly 401. The cable assembly 401 is preferably attached to the coaxial cable connector 203 by soldering the outer conductor 403 to an interior surface of the cable interface 301. Furthermore, a serve shield (not shown) that is part of the cable assembly 401 may be soldered to an exterior surface of the cable interface 301 in order to strengthen the physical connection between the cable assembly 401 and the coaxial cable connector 203. The inner conductor 404 and the outer conductor 403 are configured to conduct a probe signal to the measuring instrument 103 (FIG. 1). The wires 405 are used for conducting power and/or control signals between the measuring instrument 103 and the amplifier unit 202 (FIG. 2).

Figure 4B:
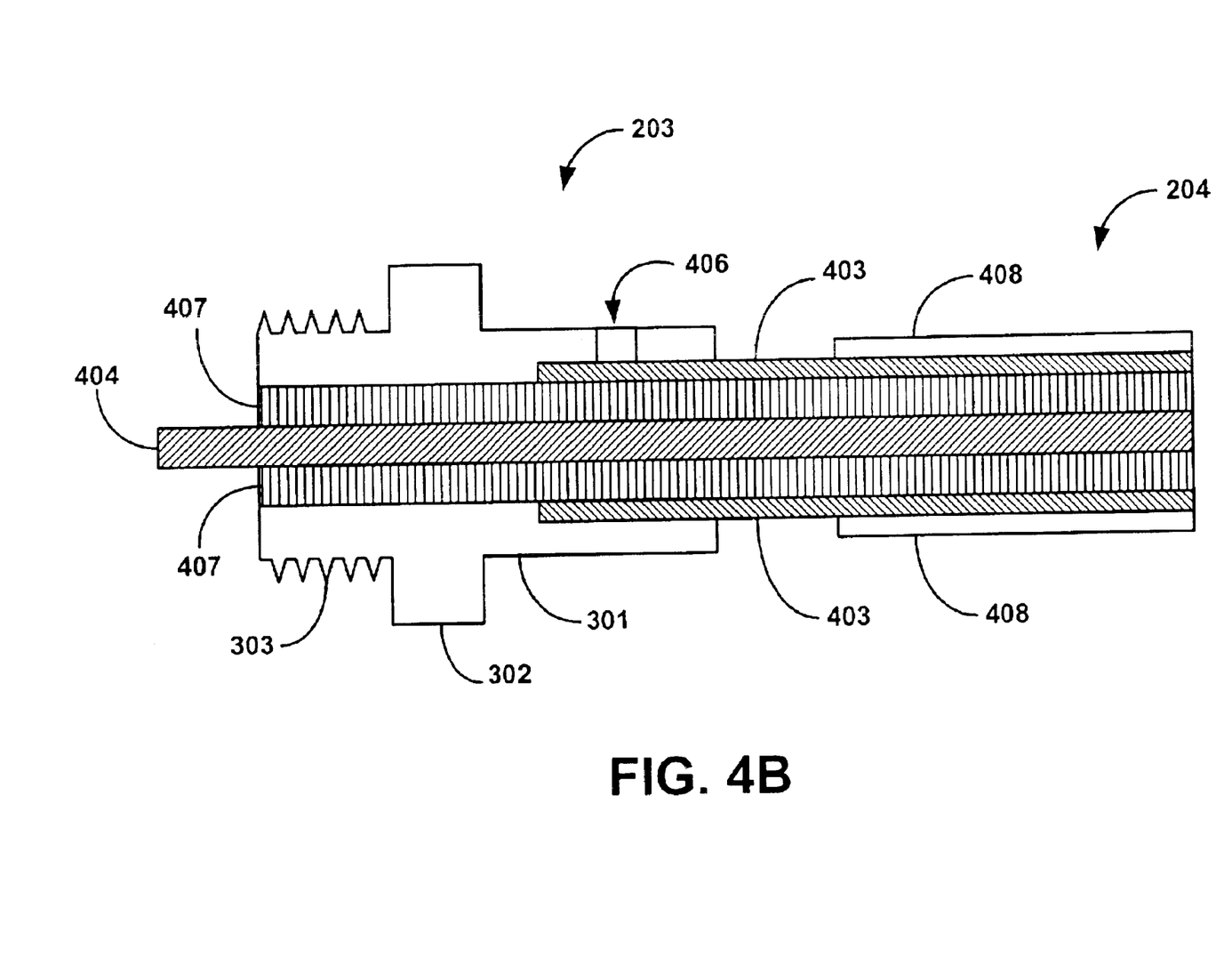
FIG. 4B is a schematic diagram showing an embodiment of a coaxial cable connector that is connected to a coaxial cable.

FIG. 4B is a schematic diagram depicting a coaxial cable 204 that is connected to a connector 203. The coaxial cable 204 includes an inner conductor 404 and an insulation layer (dielectric) 407 that are inserted into a hole 304 (FIGS. 3A and 3B) that extends through the coaxial cable connector 203. Furthermore, an outer conductor 403 of the coaxial cable 204 is inserted into a portion of the hole 304 that extends through the cable interface 301, and is soldered to an interior wall of the cable interface 301. Solder material may be introduced through the hole 406 during the soldering process.

Connecting the coaxial cable 204 to the coaxial cable connector 203 as shown in FIG. 4B allows the outer conductor 403 to maintain a constant inner diameter and to remain coaxial with the inner conductor 404 without experiencing any distortions or discontinuities. This can substantially reduce signal reflection at the region of contact between the outer conductor 403 and the coaxial cable connector 203, and can allow the coaxial cable 204 to support applications involving frequencies over 20 GHz. Furthermore, the process of connecting the coaxial cable 204 to the coaxial cable connector 203 may be automated thereby increasing the quality of the connection while reducing cost. Once the coaxial cable 204 is connected to the coaxial cable connector 203, the coaxial cable 204 may be easily connected to and disconnected from another electronic probe component (e.g., an amplifier unit 202 (FIG. 1)) without damaging the coaxial cable 204. The coaxial cable 204 is preferably, but not necessarily, part of the cable assembly 401 (FIG. 4A) that also includes wires 405 and an outer jacket 402 (FIG. 4A), among other protective and/or insulating layers.

Figure 5:
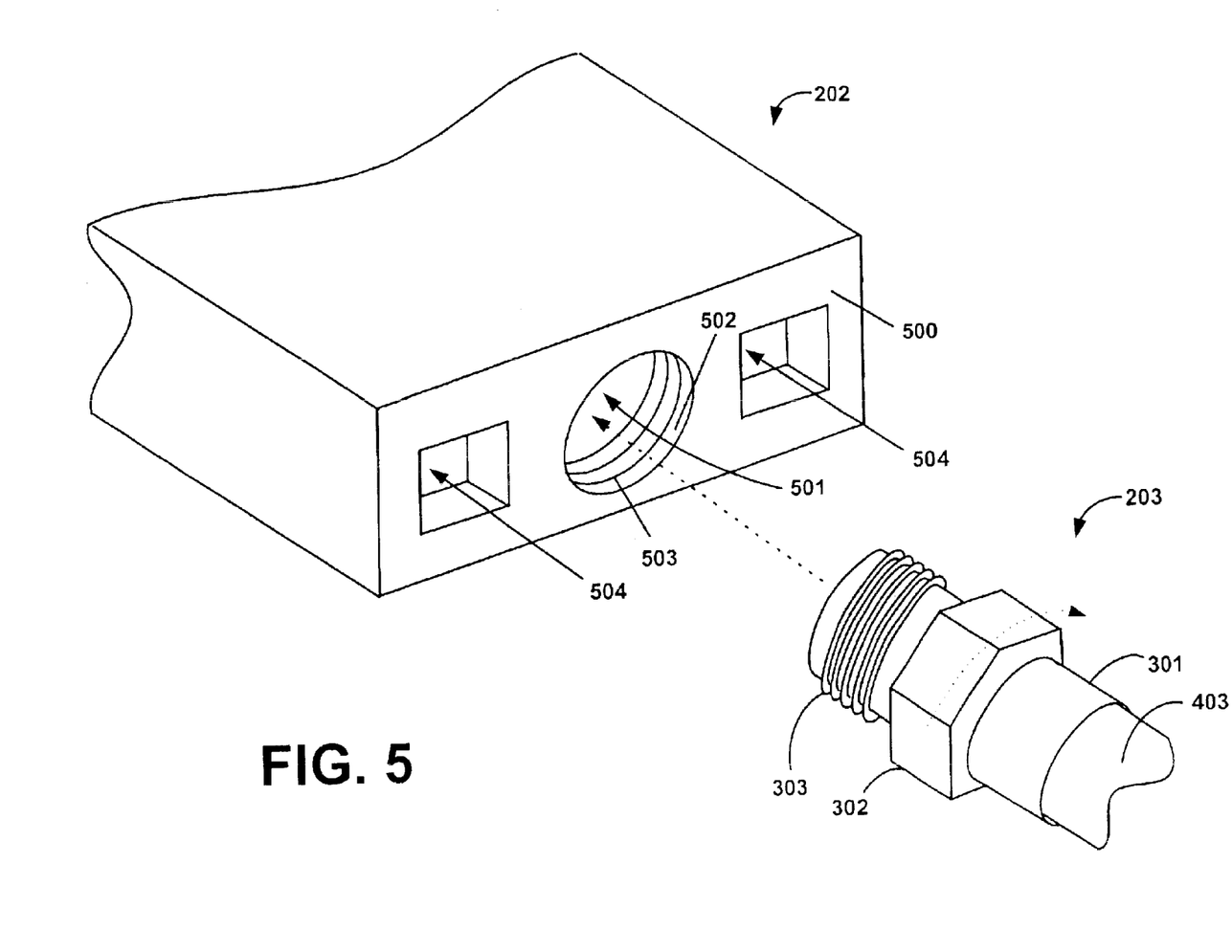
FIG. 5 is schematic diagram depicting an embodiment of a coaxial cable connector that is being attached to an amplifier unit, according the invention.

FIG. 5 is schematic diagram depicting an embodiment of a connector 203 that is in the process of being attached to an amplifier unit 202. The amplifier unit 202 includes a side surface 500 having an opening 501 that is defined by an annular surface 502. The coaxial cable connector 203 can be attached to the amplifier unit 202 by rotating the coaxial cable connector 203 such that the threaded portion 303 engages a groove 503 that is located in the cylindrical surface 502. The side surface 500 also has openings 504 that are each configured to receive one or more of the wires 405 (FIG. 4A). The threaded portion 303 can be indexed so that the wires 405 are properly positioned after the coaxial cable connector 203 is connected to the amplifier unit 202. This eliminates the need to manipulate the wires 405 into position and therefore reduces the likelihood of damage to the coaxial cable 204 that may be caused by such manipulation.

Some of the advantages of connecting a coaxial cable 204 (FIG. 4B) to an amplifier unit 202 via a connector 203 as shown in FIG. 5 can include:

a) desirable electrical properties, such as low levels of signal reflection (e.g., less than 2%), that can be maintained at signal frequencies exceeding 20 GHz;

b) a physically strong connection;

c) a connection that can be easily made;

d) a connection and that is less costly to implement than prior approaches;

e) the coaxial cable 204 can be easily disconnected without being damaged; and/or f) the coaxial cable 204 maintains an effective inter-cable impedance of 50 ohms.

Note, in some embodiments, few or none of the aforementioned advantages may be exhibited.

Figure 6:
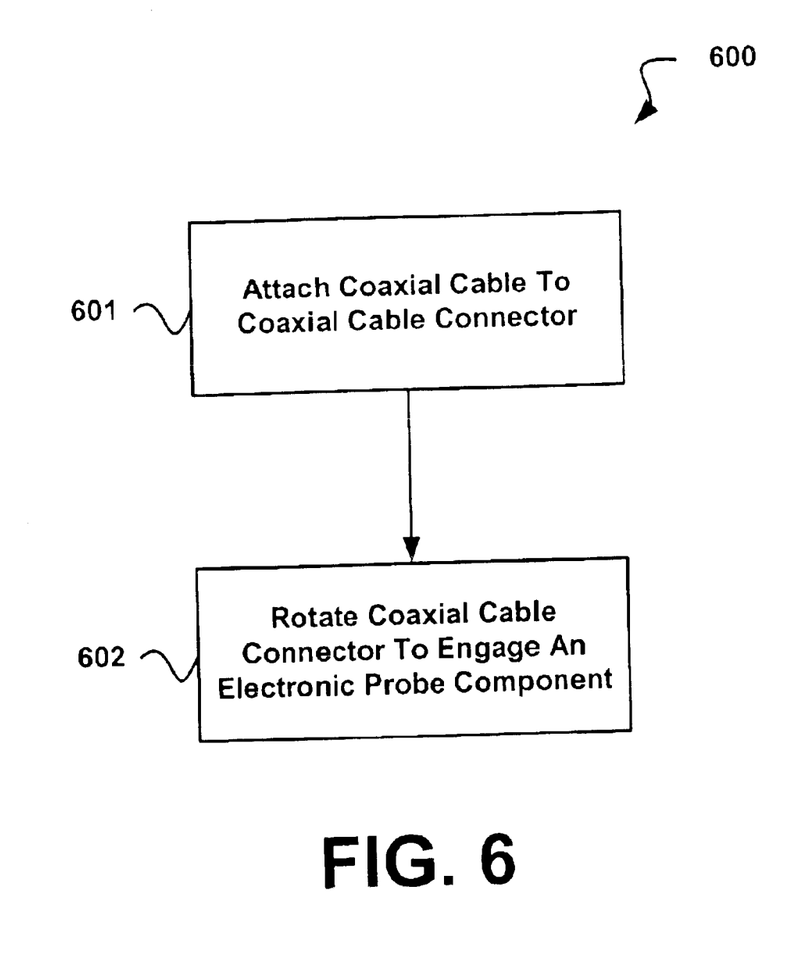
FIG. 6 is a flow chart depicting an embodiment of a method for assembling an electronic probe.

FIG. 6 is a flow chart depicting an embodiment of a method 600 for assembling an electronic probe 102. In step 601, a coaxial cable 204 (FIG. 2) is attached to a connector 203 (FIG. 2). The coaxial cable 204 is preferably attached to the coaxial cable connector 203 by soldering the outer conductor 403 of the coaxial cable 204 to an interior surface of the coaxial cable connector 203. The coaxial cable connector 203 is then rotated to engage another electronic probe component, as indicated in step 602. For example, the coaxial cable connector 203 can be connected to an amplifier unit 202 as illustrated in FIG. 5. Once the coaxial cable connector is fully engaged with the other electronic probe component, the coaxial cable 204 may then conduct a probe signal to or from such component (depending on a desired implementation). If the coaxial cable 204 is suspected of being defective, then the coaxial cable connector 203 enables the coaxial cable 204 to be easily disconnected from the amplifier unit 202 without damaging the coaxial cable 204. Once a coaxial cable 204 is disconnected from the amplifier unit 202, then the coaxial cable 204 may be easily replaced with another coaxial cable using the method 600.

It should be emphasized that the above-described embodiments are merely possible examples, among others, of the implementations. Many variations and modifications may be made to the above-described embodiments. All such modifications and variations are intended to be included herein within the scope of the disclosure and protected by the following claims.

What is claimed:

1. An electronic probe for testing a device under test (DUT), the electronic probe comprising:
   a DUT interface configured to contact a DUT;
   a probe housing configured to house at least one electronic component, the probe housing coupled to the DUT interface;
   a coaxial cable connector configured to rotationally engage the probe housing, the coaxial cable connector having:
      a first hole that extends through the coaxial cable connector,
      at least one inner surface that faces at least a portion of the first hole, and
      at least one outer surface; and
   a coaxial cable having an inner conductor and an outer conductor, the outer conductor being attached to the at least one inner surface of the coaxial cable connector, and the inner conductor extending through the first hole in the coaxial cable connector.

2. The electronic probe of claim 1, wherein the at least one electronic components comprises an amplifier.

3. The electronic probe of claim 1, wherein the electronic probe is at least one of a voltage probe and a current probe.

4. The electronic probe of claim 1, wherein the outer conductor is soldered to the at least one inner surface of the coaxial cable connector.

5. The electronic probe of claim 1, wherein the at least one outer surface has a threaded portion and the coaxial cable connector rotationally engages the probe housing via the threaded portion.

6. The electronic probe of claim 1, wherein the coaxial cable connector includes a portion configured to engage a rotational tool.

7. The electronic probe of claim 6, wherein the rotational tool is a wrench.

8. The electronic probe of claim 1, wherein the first hole that extends through the coaxial cable connector is cylindrically shaped.

9. The electronic probe of claim 1, wherein the electronic probe is configured to provide an electronic signal to a measuring instrument that is one of an oscilloscope, a spectrum analyzer, a logic analyzer, a vector analyzer, a network analyzer, or a time interval analyzer.

10. The electronic probe of claim 1, wherein a second hole extends from the at least one outer surface to the at least one inner surface and is configured to enable solder material to be placed in the second hole such that the solder material contacts the at least one inner surface.

11. An electronic probe comprising:
    a housing configured to house electronic components;
    a coaxial cable connector configured to rotationally engage the housing, the coaxial cable connector having a first hole that extends through the coaxial cable connector, at least one inner surface that faces at least a portion of the first hole, and at least one outer surface; and
    a coaxial cable having an inner conductor and an outer conductor, the outer conductor being attached to the at least one inner surface of the coaxial cable connector, and the inner conductor extending through the first hole in the coaxial cable connector;
    wherein the coaxial cable and the coaxial cable connector are configured such that less than 2% of a signal that is conducted through the coaxial cable at a frequency greater than 20 GHz is reflected at or near the coaxial cable connector.

12. The electronic probe of claim 11, wherein the outer conductor is soldered to the at least one inner surface of the coaxial cable connector.

13. The electronic probe of claim 11, wherein the at least one outer surface has a threaded portion and the coaxial cable connector rotationally engages the probe housing via the threaded portion.

14. The electronic probe of claim 11, wherein a second hole extends from the at least one outer surface to the at least one inner surface.

15. The electronic probe of claim 14, wherein a longitudinal axis of the second hole is substantially perpendicular to a longitudinal axis of the first hole.

16. A method for manufacturing an electronic probe comprising:
    providing a coaxial cable having an inner conductor and an outer conductor;
    providing a coaxial cable connector having a first hole that extends through the coaxial cable connector, at least one inner surface that faces at least a portion of the first hole, and at least one outer surface;
    attaching the coaxial cable to the coaxial cable connector such that the outer conductor is attached to the at least one inner surface of the coaxial cable connector, and the inner conductor extends through the first hole in the coaxial cable connector; and
    rotationally engaging the coaxial cable connector with a probe housing that houses at least on electronic component, the at least one electronic component configured to process a signal from a device under test (DUT) interface.

17. The method of claim 16, wherein the coaxial cable connector includes a portion configured to engage a rotational tool.

18. The method of claim 16, wherein the electronic probe is configured to provide an electronic signal to a measuring instrument that is one of an oscilloscope, a spectrum analyzer, a logic analyzer, a vector analyzer, a network analyzer, or a time interval analyzer.

19. The method of claim 16, wherein the at least one electronic component comprises an amplifier.

20. The method of claim 16, wherein the electronic probe is at least one of a voltage probe and a current probe.

21. The method of claim 16, wherein attaching the coaxial cable to the coaxial cable connector comprises soldering the outer conductor of the coaxial cable to the at least one inner surface of the coaxial cable connector.

22. The method of claim 16, wherein rotationally engaging the coaxial cable connector with the probe housing comprises engaging a threaded portion of the at least one outer surface of the coaxial cable connector with a groove located in a cylindrical surface of the probe housing.

23. A method for terminating a coaxial cable, the method comprising:

providing a coaxial cable having an inner conductor and an outer conductor;

providing a coaxial cable connector; and bonding the outer conductor to the coaxial cable connector such that less than 2% of a signal that is conducted by the coaxial cable at a frequency greater than 20 GHz is reflected near the coaxial cable connector.

24. The method of claim 23, wherein bonding the outer conductor to the coaxial cable connector comprises soldering the outer conductor to an interior surface of the coaxial cable connector.

25. The method of claim 23, wherein the coaxial cable connector is configured to engage a probe.

26. The method of claim 25, wherein the coaxial cable connector comprises a threaded portion on an outer surface thereof, the threaded portion being configured to be rotationally engaged with a corresponding threaded portion of the probe.

27. The method of claim 25, further comprising:

electrically coupling the coaxial cable to a signal measuring device.

28. The method of claim 23, wherein the coaxial cable connector comprises:

a first hole extending lengthwise through the coaxial cable connector; and a second hole, substantially perpendicular to the first hole, extending from an outer surface of the coaxial cable connector to the first hole.

29. The method of claim 28, wherein the first hole comprises a first inner surface having a first diameter and a second inner surface having a second diameter, the method further comprising:

inserting the coaxial cable into the first hole of the coaxial cable connector such that an insulating layer surrounding the inner conductor is supported within the first inner surface and the outer conductor is supported within the second inner surface.

30. The method of claim 29, wherein:

the coaxial cable connector further comprises a face connecting the first inner surface to the second inner surface; and inserting the coaxial cable into the first hole further comprises abutting the outer conductor against the face.

31. A coaxial cable connector comprising:

a substantially cylindrical body having a longitudinal axis;

a first hole extending through the longitudinal axis of the body;

a first inner surface having a first diameter, the first inner surface facing a first portion of the first hole and being configured to surround an outer portion of a dielectric layer of a coaxial cable, the dielectric layer located between an inner conductor and an outer conductor of the coaxial cable; and a second inner surface having a second diameter, the second inner surface facing a second portion of the first hole and being configured to surround an outer portion of the outer conductor of the coaxial cable.

32. The coaxial cable connector of claim 31, wherein the second diameter of the second inner surface has a diameter substantially equal to an inner portion of the outer conductor.

33. The coaxial cable connector of claim 32, wherein the outer conductor of the coaxial cable is electrically coupled with the first inner surface to form an electrical shield surrounding the inner conductor, whereby a first electrical gap between the inner conductor and the outer conductor is substantially equal to a second electrical gap between the inner conductor and the first inner surface.

34. The coaxial cable connector of claim 33, wherein the distance between the inner conductor and the electrical shield is substantially constant along the length of the longitudinal axis.

35. The coaxial cable connector of claim 31, wherein the second diameter is greater than the first diameter.

36. The coaxial cable connector of claim 31, further comprising a face portion connecting the first inner surface to the second inner surface.

37. The coaxial cable connector of claim 36, wherein the face portion is configured to abut the outer conductor of the coaxial cable.

38. The coaxial cable connector of claim 36, wherein the face portion comprises a height that is substantially equal to the width of the outer conductor of the coaxial cable.

39. The coaxial cable connector of claim 31, further comprising a second hole extending from an outer surface of the body to the second inner surface.

40. The coaxial cable connector of claim 39, further comprising a solder material located within the second hole, the solder material configured to adhere the outer conductor to the body.

* * * * *

UNITED STATES PATENT AND TRADEMARK OFFICE
CERTIFICATE OF CORRECTION

PATENT NO. : 6,876,183 B2
DATED : April 5, 2005
INVENTOR(S) : Cannon

It is certified that error appears in the above-identified patent and that said Letters Patent is hereby corrected as shown below:

Column 5,
Line 40, delete "components" and insert -- component --.

Column 6,
Line 46, delete "on" and insert -- one --.

Signed and Sealed this

Twenty-fourth Day of January, 2006

JON W. DUDAS
*Director of the United States Patent and Trademark Office*